United States Patent
Jectic et al.

(10) Patent No.: US 6,747,452 B1
(45) Date of Patent: Jun. 8, 2004

(54) DECOUPLING CIRCUIT FOR MAGNETIC RESONANCE IMAGING LOCAL COILS

(75) Inventors: Jovan Jectic, West Allis, WI (US); Ashok Menon, Milwaukee, WI (US); Derek Seeber, Wauwatosa, WI (US)

(73) Assignee: IGC Medical Advanced, Inc., Milwaukee, WI (US)

( * ) Notice: Subject to any disclaimer, the term of this patent is extended or adjusted under 35 U.S.C. 154(b) by 0 days.

(21) Appl. No.: 10/303,586

(22) Filed: Nov. 22, 2002

(51) Int. Cl.[7] .................................................. G01V 3/00
(52) U.S. Cl. ........................ 324/311; 324/318; 324/322
(58) Field of Search ................................ 324/300, 307, 324/309, 311, 318, 322

(56) References Cited

U.S. PATENT DOCUMENTS

| | | | |
|---|---|---|---|
| 5,136,244 A | | 8/1992 | Jones et al. |
| 5,166,618 A | * | 11/1992 | Jones et al. ................. 324/318 |
| 5,221,902 A | | 6/1993 | Jones et al. |
| 5,302,901 A | * | 4/1994 | Snelten ........................ 324/322 |
| 5,370,118 A | * | 12/1994 | Vij et al. ...................... 600/422 |
| 5,621,323 A | * | 4/1997 | Larsen ........................ 324/318 |
| 5,646,530 A | * | 7/1997 | Strenk et al. ................ 324/318 |
| 5,751,146 A | * | 5/1998 | Hrovat ........................ 324/318 |
| 5,804,969 A | * | 9/1998 | Lian et al. ................... 324/318 |
| 5,998,999 A | * | 12/1999 | Richard et al. ............. 324/318 |
| 6,414,485 B1 | * | 7/2002 | Kato et al. ................... 324/307 |
| 6,414,488 B1 | * | 7/2002 | Chmielewski .............. 324/311 |
| 6,512,374 B1 | * | 1/2003 | Misic et al. ................. 324/319 |

* cited by examiner

Primary Examiner—Christopher W. Fulton
Assistant Examiner—Dixomara Vargas
(74) Attorney, Agent, or Firm—Quarles & Brady LLP

(57) ABSTRACT

A decoupling circuit for decoupling an local coil during the application of an RF excitation signal in a magnetic resonance imaging system includes a passive switching circuit for switching an inductor in parallel with a capacitive circuit in the local coil, and a discharge circuit for discharging residual currents from the circuit, therefore allowing for rapid coupling and decoupling of the local coil.

19 Claims, 2 Drawing Sheets

DECOUPLING CIRCUIT FOR MAGNETIC RESONANCE IMAGING LOCAL COILS

CROSS-REFERENCE TO RELATED APPLICATIONS

STATEMENT REGARDING FEDERALLY SPONSORED RESEARCH OR DEVELOPMENT

BACKGROUND OF THE INVENTION

The field of the invention is magnetic resonance imaging (MRI) and in particular decoupling circuits for local coils for use in receiving MRI signals.

In MRI, a uniform magnetic field $B_0$ is applied to an imaged object along the z-axis of a Cartesian coordinate system, the origin of which is approximately centered within the imaged object. The effect of the magnetic field $B_0$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 42.6 MHz/Tesla and therefore in a 1.5 Tesla polarizing magnetic field $B_0$ the resonant or Larmor frequency of water is approximately 63.9 MHz.

In a typical imaging sequence, the RF excitation signal is centered at the Larmor frequency (o and applied to the imaged object at the same time as a magnetic field gradient $G_z$ is applied. The gradient field $G_z$ causes only the nuclei in a slice through the object along an x-y plane to have the resonant frequency $\omega$ and to be excited into resonance.

After the excitation of the nuclei in this slice, magnetic field gradients are applied along the x and y axes. The gradient along the x-axis, $G_x$, causes the nuclei to precess at different frequencies depending on their position along the x-axis, that is, $G_x$ spatially encodes the precessing nuclei by frequency. The y axis gradient, $G_y$, is incremented through a series of values and encodes y position into the rate of change of phase of the processing nuclei as a function of gradient amplitude, a process typically referred to as phase encoding.

A weak nuclear magnetic resonance generated by the precessing nuclei may be sensed by the local coil and recorded as an NMR signal. From this NMR signal, a slice image may be derived according to well-known reconstruction techniques. An overview NMR image reconstruction is contained in the book "Magnetic Resonance Imaging, Principles and Applications" by D. N. Kean and M. A. Smith.

The quality of the image produced by MRI techniques is dependent, in part, on the strength of the NMR signal received from the precessing nuclei. For this reason, it is known to use an independent RF receiving coil placed in close proximity to the region of interest of the imaged object to improve the strength of this received signal. Such coils are termed "local coils" or "local coils". The smaller area of the local coil permits it to accurately focus on NMR signal from the region of interest. The local coils are tuned with capacitors placed in series with the distributed inductance of the coil conductors to create a series resonance near the NMR frequency that helps reject noise signals of other frequencies.

A major technical problem in NMR systems is "decoupling" the local coil from the RF excitation signal from the transmit coil during stimulation of the magnetic resonance. Such decoupling reduces the distortion of the excitation field by the local coil and prevents potential damage to the sensitive circuits connected to the local coil from possibly large induced voltages. Further, decoupling prevents high current flow in the local coil such as may cause damage or heating of the local coil.

One method of decoupling the local coil from the RF excitation field is through the use of one or more diodes used as solid state switches and positioned along the local coil to be activated by an external electrical signal before the application of the RF excitation field itself. In one such "active decoupling" technique, series connected pin diodes and inductors are placed in parallel across the tuning capacitors with the inductors sized to create a parallel resonance at the NMR frequency when the diodes are conducting. As is understood in the art, the created parallel resonance blocks current flow at that diode.

Alternatively, it may be desirable to also employ "passive decoupling" that does not require the application of a direct current to the diodes from an external source. In passive decoupling, parallel back-to-back diodes may be used to produce a circuit element that conducts at voltages above the level of the NMR signal but below the level of the RF excitation signal.

In a combined active and passive decoupling system, these back-to-back diodes are placed in parallel with the pin diode to activate at times when the pin diode is not conducting and thus, with the pin diode, to provide both active and passive decoupling. A direct-current blocking capacitor is placed in series with the back-to-back diodes to block the direct current used to activate the pin diodes.

New MRI techniques require repeated RF excitation at a high repetition rate. With these techniques, it is important that the coil be returned to a normal state as soon as possible after decoupling. Unfortunately, slow recovery time, particularly of the combined active and passive decoupling circuits, limits the speed at which NMR signals may be acquired.

BRIEF SUMMARY OF THE INVENTION

The present inventors have determined that the recovery time of the combined active and passive decoupling circuit can be significantly improved by providing a discharge path shunting the passive decoupling circuit. Although the inventors do not wish to be bound by a particular theory, it is believed that the discharge path provides an alternative, lower impendence discharge path, than the diodes of the passive decoupling circuit. The discharge path allows discharge of the charge accumulated, for example, on the blocking capacitor used to separate the active and passive components. By discharging this energy faster, the diodes are returned more quickly to a non-conducting state suitable for detection of an NMR signal.

Specifically, the present invention provides a circuit for decoupling a local coil used in a magnetic resonance system where the local coil includes at least one series capacitor. The circuit provides a decoupling inductor sized to create a parallel resonance at an NMR frequency when connected in parallel with the series capacitor. A passive decoupling circuit connects the decoupling inductor in parallel with the series capacitor upon the occurrence of an RF excitation signal. A discharge circuit is provided to discharge the passive decoupling circuit after conclusion of the RF excitation signal.

It is thus is one object of the invention to provide faster recovery of a passive decoupling circuits to allow faster acquisition of a series of NMR signals enabling the use of local coils with a variety of new MRI techniques.

The passive decoupling circuit may be connected in series with the decoupling inductor and the series combination of the passive decoupling circuit and the decoupling inductor may be placed in parallel with the series capacitance.

Thus, it is another object of the invention to provide a system that works with well-known passive decoupling circuits.

The passive decoupling circuit may include a capacitor connected in series with first and second diodes in parallel back-to-back configuration.

Thus, it is another object of the invention to provide a circuit that discharges the blocking capacitor used when a passive decoupling circuit is combined with active decoupling.

The discharge circuit may be a discharge inductor coupled in parallel across the first and second diode.

Thus, it is another object of the invention to provide a discharge path that compliments the diodes in the circuit (that provide decreased discharge current flow with time) the inductor providing an increasing discharge current flow with time per normal inductor characteristics.

The local coil may be any type of MRI local coil having series capacitances and requiring decoupling including local coils, birdcage coils, quadrature coils and phased array coils.

Thus, it is another object of the invention to provide improved imaging speed to a variety of coil types.

These particular objects and advantages may apply to only some embodiments falling within the claims and thus do not define the scope of the invention.

DETAILED DESCRIPTION OF THE PREFERRED EMBODIMENT

Figure 1:
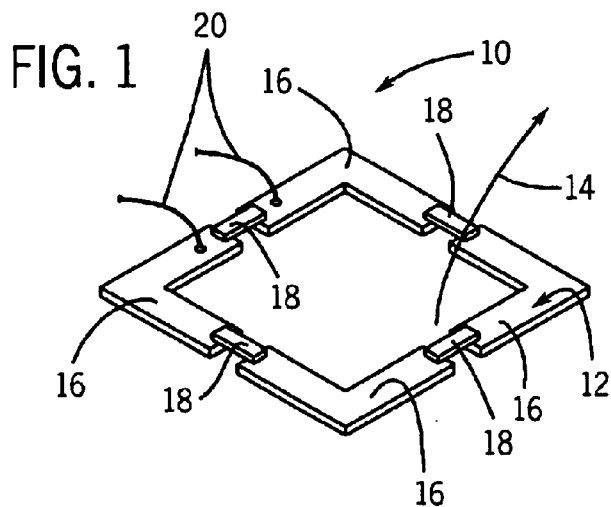
FIG. 1 is a simplified schematic of an example local coil having series tuning capacitors tuning the local coil to a resonant frequency.

Referring now to FIG. 1, a local coil 10 may include a loop 12 providing an antenna to receive a changing magnetic flux from an NMR signal 14.

The loop 12 provides a continuous path of conductors 16 (having distributed inductance) joined by capacitors 18 to provide a series resonant loop tuned to the frequency of the expected NMR signal 14. Leads 20 may be attached to the local coil 10 to communicate a signal detected by the antenna of loop 12 to signal processing circuitry of a magnetic resonance imaging (MRI) machine and to provide a path for the introduction of direct current used to activate active portions of the decoupling circuit as will be described below.

Figure 2:
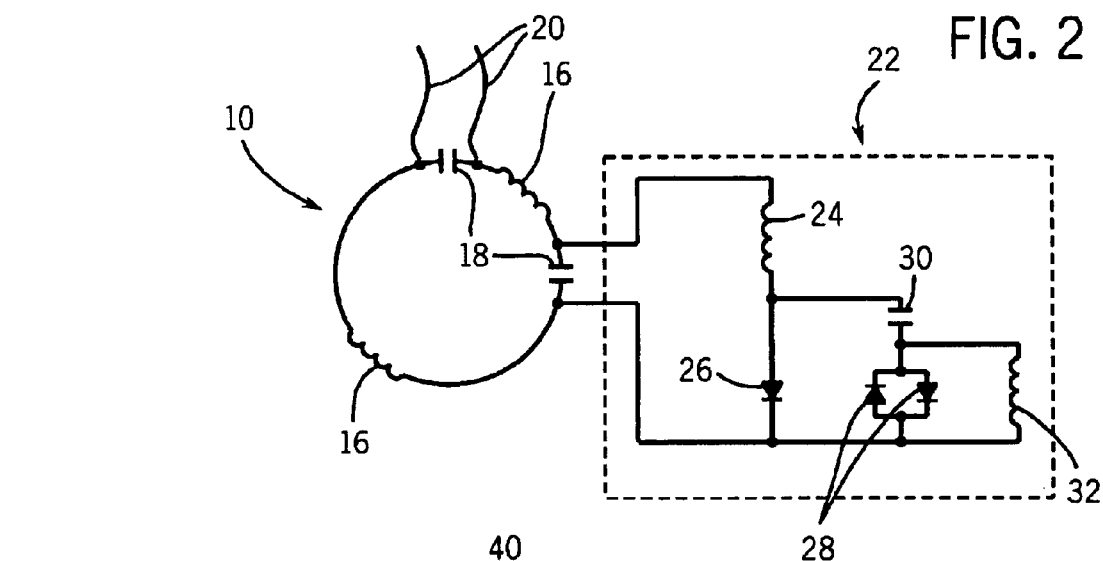
FIG. 2 is a schematic diagram of a decoupling circuit constructed in accordance with the present invention as attached to the local coil of FIG. 1.

Referring now to FIG. 2, decoupling circuitry 22 may be placed in parallel with one or more of the series capacitors 18'. The decoupling circuitry 22 includes a decoupling inductor 24 that, when connected in parallel to one of the capacitors 18', creates a parallel resonance at the frequency of the NMR signal 14. The parallel resonance blocks current flow through the portion of the local coil 10 bridged by that capacitor 18.

In the decoupling circuitry 22, a pin diode 26 is connected in series with the decoupling inductor 24 and the combination of the series-connected decoupling inductor 24 and pin diode 26 is connected in parallel across the capacitor 18'. As is understood in the art, a direct current (DC) introduced through leads 20 may bias diode 26 into conduction essentially switching decoupling conductor 24 into parallel configuration with capacitor 18'. As is understood in the art, this DC bias through leads 20 is introduced before the RF excitation signal and turned off before the acquisition period for the NMR signal 14.

Referring still to FIG. 2, in situations where the diode 26 cannot be activated, for example, when the coil has become disconnected from the MRI machine and yet is still within the influence of the RF excitation field, a passive decoupling may be provided by parallel connected back-to-back diodes 28. As will be understood in the art, these diodes provide a conduction path for current above a nominal voltage, for example, 0.7 volts passing in either direction through this parallel connection. Generally, this threshold voltage will be higher than the voltage induced by the NMR signal and lower than the voltage induced by the RF excitation signal. Thus decoupling inductor 24 may be switched into parallel configuration with the capacitor 18' by either the pin diode 26 (receiving a DC biasing signal) or the back-to-back diodes 28 (activated by the RF excitation signal).

In order that the biasing current for diodes 26 not be diverted through the back-to-back diodes 28, the back-to-back diodes 28 are normally connected in series with a blocking capacitor 30 and the series connected back-to-back diodes 28 and blocking capacitor 30 placed in parallel with diode 26. Blocking capacitor 30 is sized to provide essentially a short circuit at the desired RF excitation frequency.

At the conclusion of the RF excitation period, the blocking capacitor 30 may be charged and begins discharging through one of back-to-back diodes 28. This discharging holds the diode of the back-to-back diodes 28 in conduction prolonging the decoupling action and thereby continuing to block reception of the NMR signal 14.

The present invention reduces this discharge time by the addition of a discharge inductor 32. The discharge inductor 32 is sized to provide essentially an open circuit at the RF excitation frequency. Charge on blocking capacitor 30 may now be conducted through discharge inductor 32 which, in contrast to back-to-back diodes 28, where declining voltage provide asymptotically decreasing current flow, the discharge inductor 32 provides increasing current conduction over time as opposed to the diodes with.

This decoupling circuitry 22 may be duplicated for others of the capacitors 18.

Figure 3:
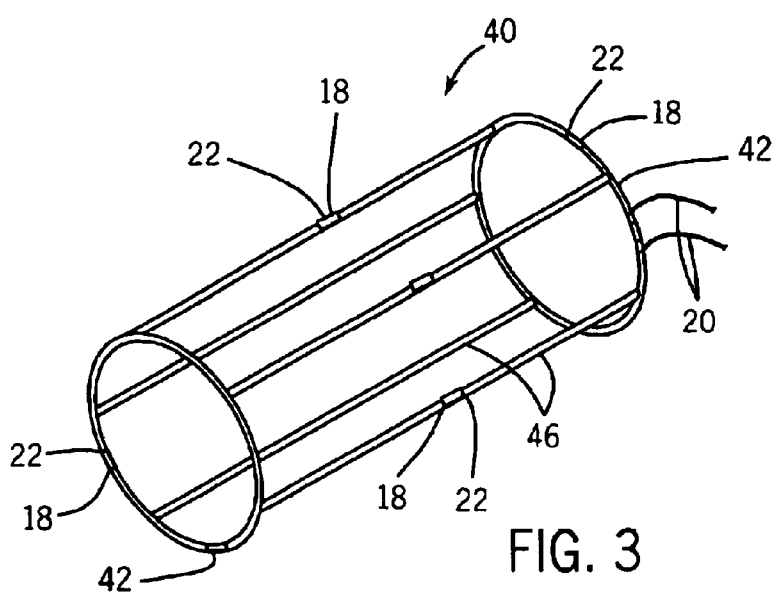
FIG. 3 is a perspective view of a birdcage coil showing possible locations of the decoupling circuit of the present invention.

Referring now to FIG. 3, a well-known birdcage style coil 40 may include end rings 42 and rungs 46 along which tuning capacitors 18 may be placed so as to tune the coil properly to the desired operating frequency. These capacitors provide sites of location for passive active decoupling circuitry 22 of the present invention.

Figure 4:
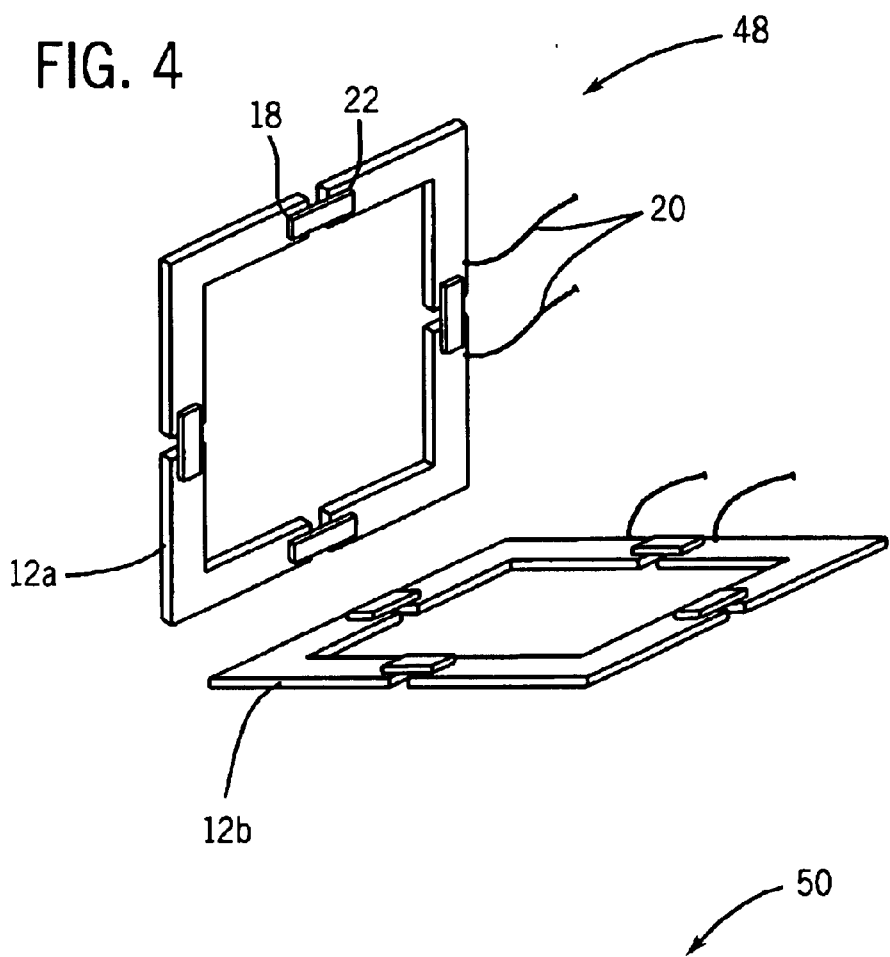
FIG. 4 is a perspective view of a quadrature coil showing possible locations of the decoupling circuit of the present invention.
Figure 5:
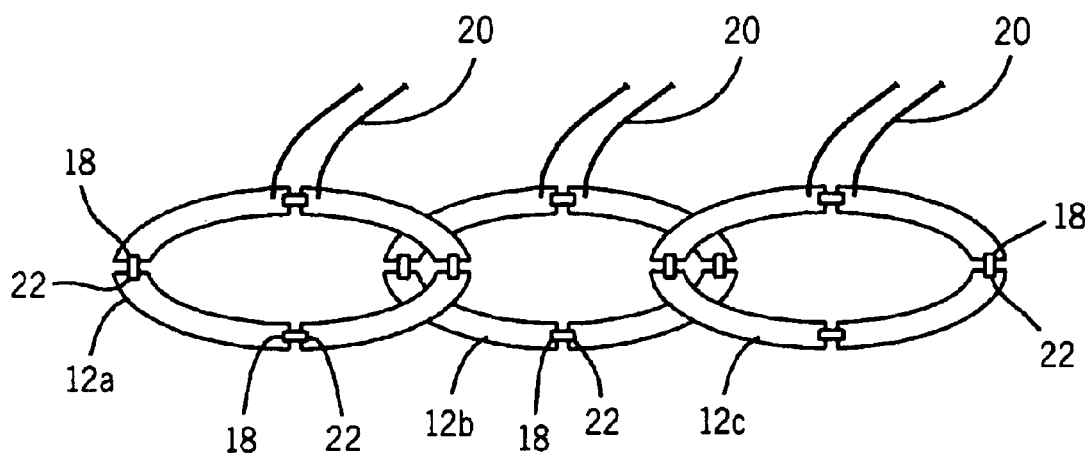
FIG. 5 is a perspective view of a phased array coil showing possible locations of the decoupling circuit of the present invention.

Likewise referring to FIG. 4, a quadrature coil 48 having perpendicular loops 12a and 12b and phased array coil 50 having multiple loops 12a–12c may provide similarly capacitors 18 that may be bridged by the decoupling circuitry 22 of the present invention.

Coils of these designs and others are shown generally in U.S. Pat. Nos. 4,734,647; 5,136,244; 5,166,618; 5,277,183; 5,370,118; 5,256,791; 5,370,118; 5,619,996; and 6,438,402 all assigned to the assignee of the present invention and hereby incorporated by reference.

It should be understood that the methods and apparatuses described above are only exemplary and do not limit the scope of the invention, and that various modifications could be made by those skilled in the art that would fall under the scope of the invention. For example, although the circuit is shown as including both an active and passive switch, the invention can also be applied to passive decoupling networks alone. It is specifically intended that the present invention not be limited to the embodiments and illustrations contained herein, but include modified forms of those embodiments including portions of the embodiments and combinations of elements of different embodiments as come within the scope of the following claims.

We claim:

1. A circuit for decoupling a local coil used in a magnetic resonance system, the local coil including at least one series capacitor, the circuit comprising:
    a decoupling inductor providing a parallel resonance at an NMR frequency when connected in parallel with the series capacitor; and
    a passive decoupling circuit connecting the decoupling inductor in parallel with the series capacitor upon the presence of an RF excitation signal;
    a discharge circuit for discharging the passive decoupling circuit after conclusion of the RF excitation signal;
    wherein the local coil may to detect an NMR signal after conclusion of the RF signal.

2. The circuit as recited in claim 1 wherein the passive decoupling circuit is connected in series with the decoupling inductor and the series combination of the passive decoupling circuit and the decoupling inductor is placed in parallel with the series capacitance.

3. The circuit as recited in claim 2, wherein the passive decoupling circuit comprises a capacitor connected in series with first and second diodes in parallel back-to-back configuration.

4. The circuit as recited in claim 1, wherein the discharge circuit comprises a discharge inductor coupled in parallel across the first and second diode to provide a direct current path across the first and second diodes.

5. The circuit as recited in claim 1, wherein the local coil comprises a birdcage coil.

6. The circuit as recited in claim 1, wherein the local coil comprises a single loop.

7. The circuit as recited in claim 1, wherein the local coil comprises a quadrature coil.

8. The circuit as recited in claim 1, wherein the local coil comprises a phased array coil.

9. A circuit for decoupling a local coil used in a magnetic resonance system, the local coil including at least one series capacitor, the circuit comprising:
    a decoupling inductor providing a parallel resonance at an NMR frequency when connected in parallel with the series capacitor; and
    an active decoupling circuit connecting the decoupling inductor in parallel with the series capacitor upon the application of a decoupling signal;
    a passive decoupling circuit connecting the decoupling inductor in parallel with the series capacitor upon the presence of an RF excitation signal;
    a discharge circuit for discharging the passive decoupling circuit after conclusion of the RF excitation signal;
    wherein the local coil may detect an NMR signal after conclusion of the RF signal.

10. The circuit as recited in claim 9 wherein the passive decoupling circuit is connected in series with the decoupling inductor and the series combination of the passive decoupling circuit and the decoupling inductor is placed in parallel with the series capacitance.

11. The circuit as recited in claim 10, wherein the passive decoupling circuit comprises a capacitor connected in series with first and second diodes in parallel back-to-back configuration.

12. The circuit as recited in claim 9, wherein the discharge circuit comprises a discharge inductor coupled in parallel across the first and second diode to provide a direct current path across the first and second diodes.

13. The circuit as recited in claim 9 wherein the active decoupling circuit is connected in series with the decoupling inductor and the series combination of the active decoupling circuit and the decoupling inductor is placed in parallel with the series capacitance.

14. The circuit as recited in claim 13, wherein the active decoupling circuit comprises a diode.

15. The circuit as recited in claim 14, wherein the diode is a PIN diode.

16. The circuit as recited in claim 9, wherein the local coil comprises a birdcage coil.

17. The circuit as recited in claim 9, wherein the local coil comprises a single loop.

18. The circuit as recited in claim 9, wherein the local coil comprises a quadrature coil.

19. The circuit as recited in claim 9, wherein the local coil is a phased array coil.

* * * * *

UNITED STATES PATENT AND TRADEMARK OFFICE
CERTIFICATE OF CORRECTION

PATENT NO.     : 6,747,452 B1
DATED          : June 8, 2004
INVENTOR(S)    : Jovan Jevtic et al.

It is certified that error appears in the above-identified patent and that said Letters Patent is hereby corrected as shown below:

Title page,
Item [75], Inventor, "Jovan Jectic" should read -- Jovan Jevtic --.

Column 6,
Line 41, "wherein the local coil may to detect an NMR" should read -- wherein the local coil may detect an NMR… --

Signed and Sealed this

Twenty-first Day of December, 2004

JON W. DUDAS
*Director of the United States Patent and Trademark Office*